United States Patent [19]

Gris

[11] 4,150,332
[45] Apr. 17, 1979

[54] VOLTAGE DETECTOR WITH SPRING BIASED SENSOR

[75] Inventor: Marcel P. Gris, Cloyes-sur-le-Loir, France

[73] Assignee: Internationale Patent-und Lizenz Anstalt, Vaduz, Liechtenstein

[21] Appl. No.: 838,974

[22] Filed: Oct. 3, 1977

[51] Int. Cl.² ............................................. G01R 19/16
[52] U.S. Cl. ...................................... 324/133; 324/72.5
[58] Field of Search ................... 324/51, 52, 72.5, 126, 324/127, 133, 149, 72; 339/108 TP, 109

[56] References Cited

U.S. PATENT DOCUMENTS

| | | | |
|---|---|---|---|
| 1,644,421 | 10/1927 | Doble | 324/72.5 UX |
| 1,684,768 | 9/1928 | Iler | 324/72.5 UX |
| 1,831,372 | 11/1931 | Spangler | 324/72.5 UX |
| 2,546,093 | 3/1951 | Gilbert | 324/149 X |
| 2,917,705 | 12/1959 | Clough | 324/72.5 X |
| 3,009,099 | 11/1961 | Muller | 324/52 |
| 3,868,569 | 2/1975 | Faust | 324/126 |

FOREIGN PATENT DOCUMENTS 1199016 7/1970 United Kingdom .................... 324/72.5

Primary Examiner—Gerard R. Strecker
Attorney, Agent, or Firm—Fulwider, Patton, Rieber, Lee & Utecht

[57] ABSTRACT

A voltage detector apparatus comprises a thin, cylindrical, electrically-insulative casing having an angled, finger-like probe extending axially from one end, and providing accommodation for active and other components which are assembled on a support which fits into the casing and screw-threadedly engages with the casing at its other end. The support is of electrically-insulating material and has two end portions which are spaced apart from one another by a hollow hub. The end portions accommodate active circuit components adjacent the probe end of the casing, and a buzzer or like warning device adjacent the other end of the casing. The hub is externally shaped to define with the casing recesses for accommodating batteries for powering the apparatus, and has a hollow core within which is mounted an electrical switch. The switch is operated by depressing the buzzer, which is formed as a modular unit, against spring bias, the buzzer unit being accessible for this purpose from the end of the casing.

2 Claims, 3 Drawing Figures

VOLTAGE DETECTOR WITH SPRING BIASED SENSOR

BACKGROUND OF THE INVENTION

1. Field of the Invention

The present invention relates generally to the field of electrical control apparatus, and particularly to means for preventing electric hazard.

2. Description of the Prior Art

In order to comply with safety regulations which require that the absence of voltage should be verified before undertaking work on an electrical line or an electrical installation, unipolar alternating voltage detectors are known which essentially comprise a supply source, an assembly of electronic circuits, and an acoustic and/or optical member capable of indicating the presence of a dangerous voltage on a conductor. These component elements are accommodated in an insulating case which normally carries, on its upper portion, a contact member or probe enabling an electrical connection to be established between the apparatus and a conductor the voltage state of which it is desired to verify, and, at its base, a means enabling it to be fixed to an insulating pole.

In their conventional form, these apparatuses have numerous disadvantages of a mechanical and electrical nature. In particular:

accessibility of their internal parts, including the supply source with a view to simple replacement, is often poor and requires the dismounting and remounting of several screws or mechanical parts which involves risks of loss or error in re-assembly; and the seating of the supply source is often in the form of a more or less deep cavity which is difficult to clean in the event of a leakage of electrolyte.

All these disadvantages are considerably increased and their solution is made more difficult when the users require that these apparatuses should be able to be introduced through narrow apertures, which makes it necessary to reduce their width and to increase their length.

Moreover, the known apparatuses are ill-suited for certain particular conditions of use, such as the verification of the absence of voltage at the capacitive terminals which are customarily provided at probe junctions in dry, high-tension cable installations. These terminals are protected by an insulating stopper which has to be removed before the operation and replaced afterwards, and this has customarily necessitated the use of an appropriate instrument.

SUMMARY OF THE INVENTION

With a view to overcoming these disadvantages, to improving various points of detail and likewise to permitting the easy use of the detectors on capacitive terminals at power line probe points, the invention provides a voltage detector apparatus comprising essentially an assembly support and a protective cover which is adapted to receive the assembly support and the functional elements of the voltage detector. The protective cover is a tube of generally cylindrical or prismatic shape, closed at one end and open at the other, consisting of a dielectric material and having an uninterrupted wall. The support substantially fits the volume of the internal cavity in the cover, and their assembly is preferably effected by screwing a threaded portion of the support into a tapped portion of the cover, thereby ensuring simplicity in assembly and dis-assembly of the apparatus.

BRIEF DESCRIPTION OF THE DRAWINGS

The invention will be described with reference to the following Figures, given by way of example.

DESCRIPTION OF THE PREFERRED EMBODIMENT

Figure 1:
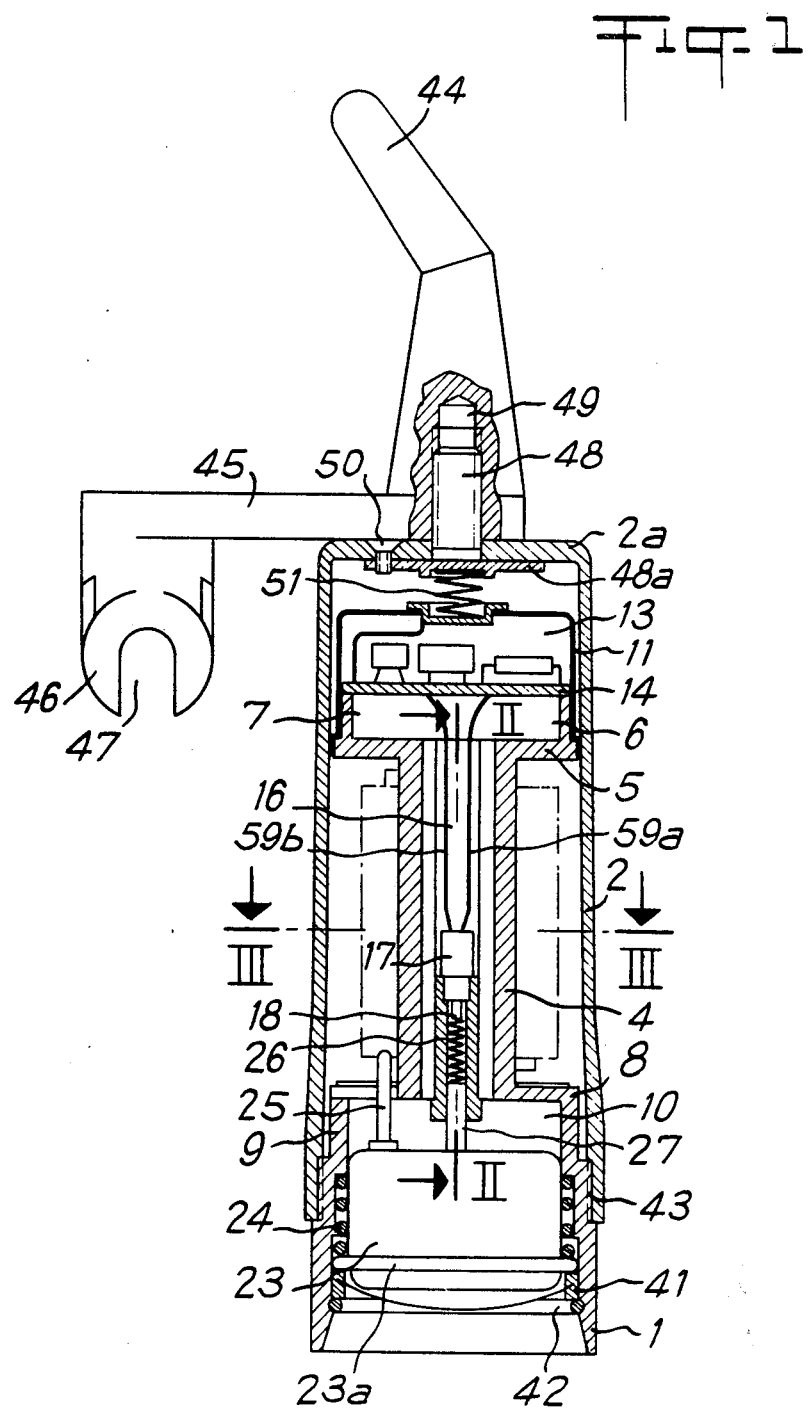
FIG. 1 is a view in longitudinal section of an apparatus according to the invention.
Figure 2:
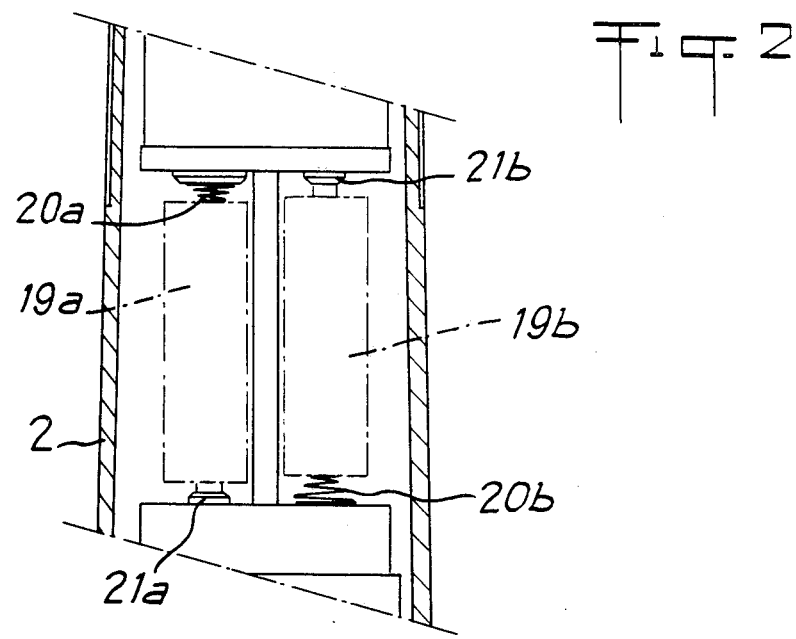
FIG. 2 is a partial view in longitudinal section of the same apparatus showing in detail the compartment provided for the supply source.
Figure 3:
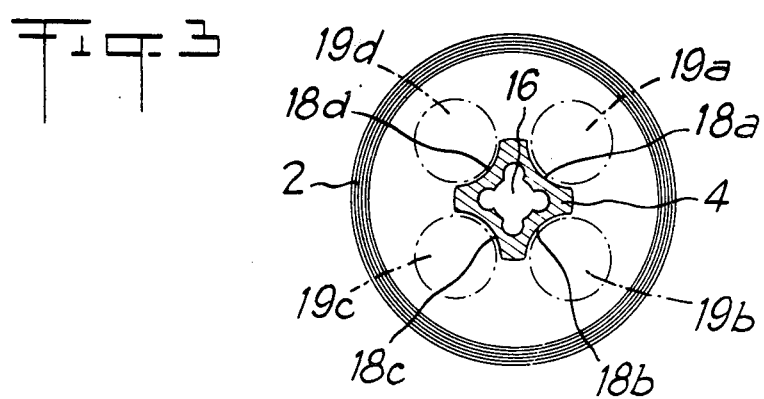
FIG. 3 is a view in cross section, corresponding to FIG. 2.

According to the form of embodiment illustrated in FIGS. 1 to 3, the detector comprises essentially an assembly support or frame 1 of insulating material, said frame being accommodated inside a protective cover 2 consisting of a tube of insulating material which is generally cylindrical in shape, particularly longer than it is wide, having an uninterrupted wall, closed at one end by a partition 2a and open at the opposite end. The latter terminates in a tapped portion which screws onto the frame 1. The frame 1, as a whole, substantially corresponds to the shape of the internal cavity in the cover 2.

In the central portion of the apparatus, the frame 1 has a hub 4 bounded at its front end by a web 5 carrying, at the front, a flange 6 which forms a cup 7 and bounded at its rear end by another web 8 carrying, at the rear, a flange 9 which forms another cup 10.

The flange 6 is covered by a metallic screening cover 11 which is attached by any appropriate means. The internal volume 13 bounded by the flange 6 and the cover 11 constitutes the accommodation for the functional circuits of the detector which are wired on a circuit board 14 situated inside the cover 11. The hub 4 is traversed longitudinally by a central passage 16 leading into the cups 7 and 10 at its two ends. Accommodated in this passage 16 is a switch 17 provided with a controlling push-rod 18 and adapted to establish electrical contact between two conductors 59a, 59b which join the circuit board 14 through the passage 16. Externally, the hub 4 carries four concave grooves 18a, 18b, 18c and 18d which are wide open and disposed in such a manner as to ensure the positioning of four dry battery cells 19a, 19b, 19c and 19d constituting the supply source of the apparatus. These dry battery cells are electrically connected to the circuits by means of contact members such as the springs 20a, 20b and the fixed contact studs 21a, 21b.

Accommodated in the cup 10 is a warning member such as a buzzer 23 having a cylindrical body and a circumferential bead 23a. A spring 24 engaged over the body 23 bears at one side against the bead 23a and at the other against a shoulder of the flange 9. This spring 24 tends to push the buzzer 23 towards the rear, but the buzzer 23 is retained against movement in this direction by a collar 41 held by a resilient ring 42. The buzzer 23 can be displaced forwards by compressing the spring 24. Displacement in this direction is guided by a rod 25 fixed perpendicularly to the bottom of the buzzer 23 and adapted to slide through an aperture in the web 8. Interposed between the push-rod 18 of the switch 17 and the bottom of the buzzer 23 are a spring 26 and a sliding rod 27 accommodated one behind the other in the passage 16. Thus when the buzzer 23 is displaced forwards by compression of the spring 24, it pushes back the rod 27 which compresses the spring 26 and actuates the push-rod 18.

The partition 2a of the cover 2 carries a metallic probe 44 in the form of an elbowed frusto-conical finger, the diameter of which corresponds to that of the ring of the insulating protective stopper provided on the capacitive terminals at probe junctions in power cable installations. At its base, the feeler 44 has a tongue 45 perpendicular to its axis and terminating in a fixing member 46 in the form of a disc with a slot 47. This disc 46 enables the apparatus to be fixed to the end of an insulating pole (not illustrated) the terminal member of which fits this disc 46. As a result of this particular arrangement, the effort necessary for removal or replacement of the insulating stopper by means of the feeler 44 can be transmitted directly from the pole to the feeler without exerting any mechanical stress on the case of the detector.

The electrical connection between the probe 44 and the functional circuits of the detector is galvanic in nature. For this purpose, the partition 2a of the cover 2 is traversed by a screw 48 assembled in a tapped seating 49 at the base of the feeler 44. Said screw 48 comprises a wide flat head 48a applied against the internal face of the partition 2a and immobilized by means such as a screw 50. A resilient contact member 51 completes the electrical connection between the feeler 44 and the functional circuits accommodated in the cover 11.

There has thus been provided a voltage detector apparatus which comprises a thin, cylindrical electrically-insulative casing having an angled, finger-like probe extending axially from one end, and providing accommodation for active and other components which are assembled on a support which fits into the casing and screw-threadedly engages with the casing at its other end. The support is of electrically-insulating material and has two end portions which are spaced apart from one another by a hollow hub. The end portions accommodate active circuit components adjacent the probe end of the casing, and a buzzer or like warning device adjacent the other end of the casing. The hub is externally shaped to define with the casing recesses for accommodating batteries for powering the apparatus, and has a hollow core within which is mounted an electrical switch. The switch is operated by depressing the buzzer, which is formed as a modular unit, against spring bias, the buzzer unit being accessible for this purpose from the end of the casing.

What is claimed is:

1. A voltage detector apparatus comprising a thin, hollow, cylindrical, electrically insulative casing enclosing a cavity therewithin, an angled finger like probe extending axially from one end of said casing and coupled in electrical communication to the inside of said cavity, an electrically insulating support which fits into said casing and which is threadably engaged therewith opposite said finger-like probe, said support having two end portions which are spaced apart one from another, wherein one of said end portions accomodates active circuit components adjacent the probe end of said casing, a hollow hub interposed between said end portions, said hub having a hollow core and being externally shaped to define recesses within said casing for accomodating batteries, an accessible warning buzzer formed as a modular unit and located in said other end portion of said support adjacent to said end of said casing opposite said probe, an electrical switch mounted within said hollow hub, whereby said switch is adapted to be operated by depressing said warning buzzer, and spring biasing means urging said warning buzzer toward said end of said casing opposite said probe.

2. A voltage detector apparatus according to claim 1 further comprising means for affixation to an insulated pole, wherein said finger-like probe has an elbowed frusto-conconical shape and is integral with said affixing means, and said affixing means is situated in the plane of said elbow and is eccentric with respect to the axis of said finger-like probe.

* * * * *